United States Patent
Li

(10) Patent No.: US 10,615,268 B2
(45) Date of Patent: Apr. 7, 2020

(54) FINFET HAVING IMPROVED GE CHANNEL INTERFACIAL LAYER

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 16/011,562

(22) Filed: Jun. 18, 2018

(65) Prior Publication Data
US 2018/0301544 A1 Oct. 18, 2018

Related U.S. Application Data

(62) Division of application No. 15/346,586, filed on Nov. 8, 2016, now Pat. No. 10,026,828.

(30) Foreign Application Priority Data

Feb. 22, 2016 (CN) .......................... 2016 1 0094545

(51) Int. Cl.
H01L 29/66 (2006.01)
H01L 21/28 (2006.01)
(Continued)

(52) U.S. Cl.
CPC .. *H01L 29/66803* (2013.01); *H01L 21/02236* (2013.01); *H01L 21/02323* (2013.01);
(Continued)

(58) Field of Classification Search
CPC ......... H01L 29/66803; H01L 21/02236; H01L 29/785
See application file for complete search history.

(56) References Cited

U.S. PATENT DOCUMENTS 5,907,780 A 5/1999 Gilmer et al.
9,318,606 B2 * 4/2016 Wang .................... H01L 29/785
(Continued)

FOREIGN PATENT DOCUMENTS

WO 2015147836 10/2015

OTHER PUBLICATIONS

U.S. Appl. No. 15/346,586, Non-Final Office Action, dated Oct. 6, 2017, 10 pages.
(Continued)

Primary Examiner — Wael M Fahmy
Assistant Examiner — Sarah K Salerno
(74) Attorney, Agent, or Firm — Kilpatrick Townsend & Stockton LLP

(57) ABSTRACT

A semiconductor device includes a substrate structure. The Substrate structure includes a substrate, a plurality of fins each protruding from the substrate structure, a germanium layer on a top surface of the fins, spacers on opposite sides of the germanium layer, an oxide layer on a surface of the germanium layer between the spacers, the oxide layer comprising silicon and germanium, a high-k dielectric layer on the oxide layer and on inner sidewalls of the spacers, and a gate electrode on the high-k dielectric layer.

10 Claims, 8 Drawing Sheets

(51) Int. Cl.
    *H01L 29/51*     (2006.01)
    *H01L 29/78*     (2006.01)
    *H01L 29/10*     (2006.01)
    *H01L 29/165*     (2006.01)
    *H01L 21/8238*     (2006.01)
    *H01L 21/02*     (2006.01)
    *H01L 21/223*     (2006.01)

(52) U.S. Cl.
    CPC ...... *H01L 21/02332* (2013.01); *H01L 21/223* (2013.01); *H01L 21/28255* (2013.01); *H01L 21/823821* (2013.01); *H01L 29/1054* (2013.01); *H01L 29/165* (2013.01); *H01L 29/51* (2013.01); *H01L 29/513* (2013.01); *H01L 29/518* (2013.01); *H01L 29/6656* (2013.01); *H01L 29/66545* (2013.01); *H01L 29/66795* (2013.01); *H01L 29/785* (2013.01); *H01L 29/7848* (2013.01)

(56) References Cited

U.S. PATENT DOCUMENTS

| | | |
|---|---|---|
| 10,026,828 B2 | 7/2018 | Li |
| 2012/0241874 A1 | 9/2012 | Kim et al. |
| 2012/0241875 A1 | 9/2012 | Tezuka et al. |
| 2013/0126986 A1 | 5/2013 | Brodsky et al. |

OTHER PUBLICATIONS

U.S. Appl. No. 15/346,586, Notice of Allowance, dated Mar. 27, 2018, 8 pages.
U.S. Appl. No. 15/346,586, Restriction Requirement, dated Jun. 6, 2017, 7 pages.
European Patent Application No. EP17156218.4, Extended European Search Report, dated May 18, 2017, 9 pages.
Kobayashi et al., "High quality GeO2/Ge interface formed by SPA radical oxidation and uniaxial stress engineering for high performance Ge NMOSFETs", Symposium on VLSI Technology Digest of Techincal Paper, Jun. 16, 2009, pp. 76-77.

* cited by examiner

FINFET HAVING IMPROVED GE CHANNEL INTERFACIAL LAYER

CROSS-REFERENCES TO RELATED APPLICATIONS

This application is a divisional of U.S. application Ser. No. 15/346,586, filed on Nov. 8, 2016, which claims priority to Chinese patent application No. 201610094545.2, filed on Feb. 22, 2016, the contents of which are incorporated herein by reference in their entirety.

FIELD OF THE INVENTION

Embodiments of the present disclosure relate to the field of semiconductor device fabrication. In particular, embodiments of the disclosure relate to a fin field effect transistor device having improved hot carrier reliability and method for manufacturing the same.

BACKGROUND OF THE INVENTION

With the development of semiconductor technology, the feature size of a semiconductor device continues to decrease. In some applications, there is a need to have high-mobility materials (e.g., for forming a channel or channel region) and high-k dielectric materials together integrated on a substrate. Since GaAs, InP, InGaAs, InAs, and GaSb have high electron mobility, and Ge has a relatively high hole mobility, these materials can be used for the channel of MOS transistor devices.

Currently, in the design of semiconductor devices, the interface between the high-k dielectric layer and the high mobility substrate may affect the device performance and reliability.

BRIEF SUMMARY OF THE INVENTION

The present disclosure provides a semiconductor device that has an improved interface between the high mobility channel materials and the high-k dielectric for obtaining higher reliability. A method for manufacturing the semiconductor device is also provided.

Embodiments of the present disclosure provide a method for manufacturing a semiconductor device. The method includes providing a semiconductor structure, which may include a substrate structure containing a substrate, a plurality of fins, a germanium layer on the top surface of the fins, a dummy gate structure on the germanium layer and including a dummy gate insulating material on the germanium layer, a dummy gate on the dummy gate insulating material, and a hardmask on the dummy gate, and spacers on opposite sides of the dummy gate structure and on a portion of the germanium layer. The method also includes forming an interlayer dielectric layer on the substrate structure covering the dummy gate structure, planarizing the interlayer dielectric layer to expose a surface of the dummy gate, removing the dummy gate and the dummy gate insulating material to expose a surface of the germanium layer, performing a silane impregnation process on the exposed surface of the germanium layer to introduce silicon to the germanium layer, and performing a first oxidation process on the germanium layer to form an oxide layer comprising silicon and germanium.

In one embodiment, the method may further include forming a source region and a drain region adjacent to the opposite sides of the germanium layer. The source region and the drain region comprise SiGe or SiP.

In one embodiment, the fins include a silicon layer below the germanium layer.

In one embodiment, the silane impregnation process is performed by immersing the semiconductor structure in an atmosphere comprising silane for a time duration between 1 minute and 30 minutes, at a temperature in a range between 400° C. and 500° C., and under a pressure in a range between 5 Torr and 20 Torr.

In one embodiment, the oxide layer includes $SiO_2$, $GeO_2$, and $SiGeO_2$.

In one embodiment, the method also includes performing a nitration process on the oxide layer to form a nitrogen-containing oxide layer. The nitration process includes the use of ammonia, nitrous oxide, nitric oxide, or nitrogen plasma.

In one embodiment, the method further includes forming a high-k dielectric layer on the nitrogen-containing oxide layer and on sidewalls of the spacers.

In one embodiment, the method also includes forming a high-k dielectric layer on the oxide layer and on sidewalls of the spacers.

In one embodiment, the method further includes performing a second oxidation process on the high-k dielectric layer to reduce vacancies in the high-k dielectric layer.

In one embodiment, the second oxidation process is performed in an atmosphere comprising oxygen at a temperature in a range between 450° C. and 550° C., and an oxygen concentration less than 10 ppm.

In one embodiment, the method further includes forming a gate electrode on the high-k dielectric layer.

In one embodiment, the fins include a first set of fins configured to form first type devices and a second set of fins configured to form second type devices.

In one embodiment, the method further includes forming a dielectric layer on the substrate structure, wherein the fins protrude from the dielectric layer.

In one embodiment, providing the semiconductor structure includes providing an initial structure comprising the substrate structure, the plurality of fins protruding from the substrate structure and containing a semiconductor layer, forming an initial germanium layer, forming a dummy gate insulating layer on the initial germanium layer, a dummy gate material layer on the dummy gate insulating layer, and a hardmask layer on the dummy gate material layer, removing a portion of the hardmask layer, a portion of the dummy gate material layer, and a portion of the dummy gate insulating layer to form a dummy gate structure, forming spacers on sidewalls of the dummy gate structure, and removing a portion of the initial germanium layer and a portion of the semiconductor layer by etching using the dummy gate structure and the spacers as a mask.

In one embodiment, the germanium layer is disposed on a top surface and lateral surfaces of each of the fins in the transverse direction.

Embodiments of the present disclosure also provide a semiconductor device that includes a substrate structure having a substrate, a plurality of fins each protruding from the substrate structure, a germanium layer on a top surface of the fins, spacers on opposite sides of the germanium layer, an oxide layer on a surface of the germanium layer between the spacers, the oxide layer comprising silicon and germanium, a high-k dielectric layer on the oxide layer and on inner sidewalls of the spacers, and a gate electrode on the high-k dielectric layer.

In one embodiment, the oxide layer is a nitrogen-containing oxide layer.

In one embodiment, the semiconductor device further includes a source region and a drain region adjacent opposite sides of the germanium layer.

In one embodiment, the fins include a silicon layer below the germanium layer. The fins may include a first set of fins for forming first type transistor devices and a second set of fins for forming second type transistor devices.

In one embodiment, the substrate structure also includes a dielectric layer on the substrate, and the fins protrude from the dielectric layer. The oxide layer, the high-k dielectric layer and the gate electrode are above the dielectric layer.

In one embodiment, the source region and the drain region include silicon germanium (SiGe) or silicon phosphorus (SiP).

In one embodiment, the semiconductor device includes an interlayer dielectric layer surrounding the spacers, the high-k dielectric layer, and the gate electrode. In one embodiment, the germanium layer is disposed on a top surface and lateral surfaces of each of the fins in the transverse direction.

The following description, together with the accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

Figure 1:
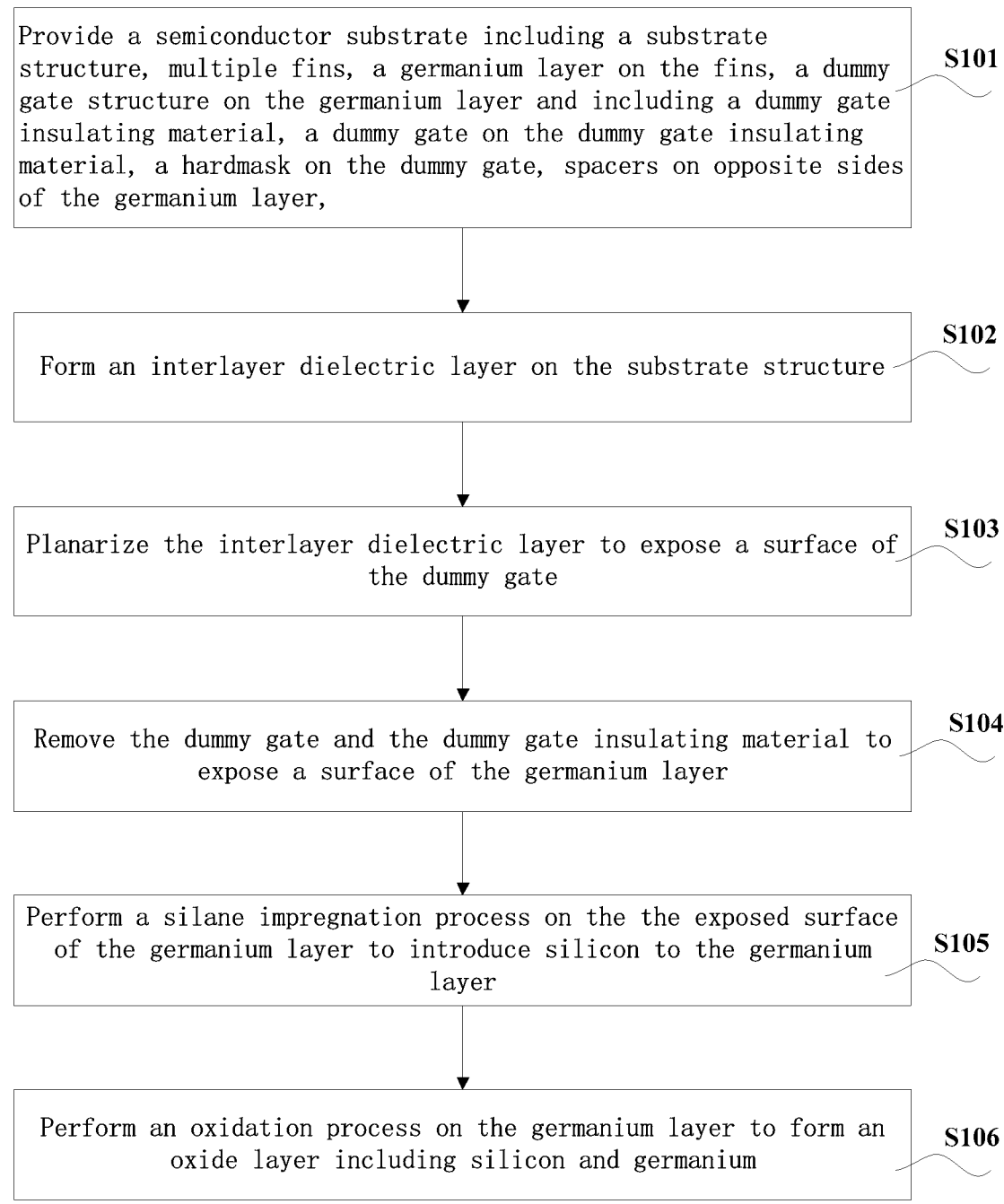
FIG. 1 is a flowchart illustrating a manufacturing method according to embodiments of the present disclosure.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to perspective cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The use of the terms first, second, third, etc. do not denote any order, but rather the terms first, second, third, etc. are used to distinguish one element from another. Furthermore, the use of the terms a, an, etc. does not denote a limitation of quantity, but rather denote the presence of at least one of the referenced items.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures.

In accordance with some embodiments of the present disclosure, FIG. 1 is a flowchart illustrating a method for manufacturing a semiconductor device. FIGS. 2 through 10 are cross-sectional views of intermediate stages of the manufacturing method according to some embodiments of the present disclosure. In the disclosure, each drawing or block in the flowchart represents a process associated with embodiments of the method described. Those of skill in the art will recognize that additional blocks and drawings that described the embodiments may be added.

Figure 2:
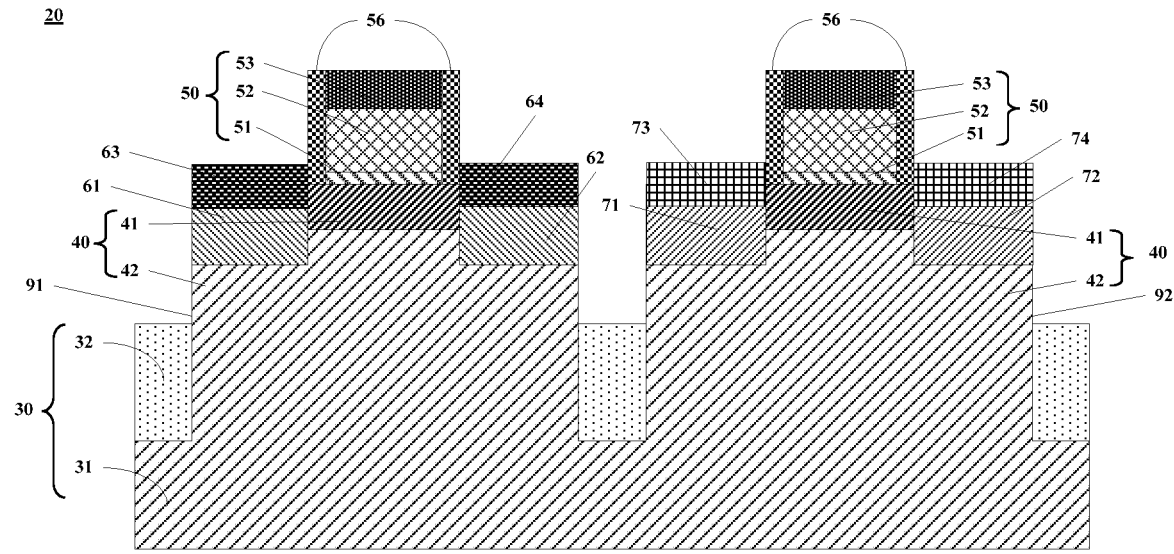
FIG. 2 is a cross-sectional view illustrating an intermediate stage of a manufacturing method according to some embodiments of the present disclosure.

Referring to FIG. 1, in block S101, a semiconductor structure is provided. FIG. 2 is a cross-sectional view illustrating a semiconductor substrate 20 according to some embodiments of the present disclosure. As shown in FIG. 2, semiconductor substrate 20 may include a substrate structure 30 having a substrate (e.g., silicon) 31, a plurality of fins 40 protruding from substrate structure 30. Fins 40 each include a germanium layer 41 on the top surface. Semiconductor substrate 20 may further include a dummy gate structure 50 on germanium layer 41. Dummy gate structure 50 includes a dummy gate insulating material (e.g., silicon dioxide) 51 on germanium layer 41, a dummy gate (e.g., polysilicon) 52 on dummy gate insulating material 51, and a hardmask (e.g., silicon nitride) 53 on dummy gate 52. Semiconductor substrate 20 may also include spacers 56 disposed on opposite sides of dummy gate structure 50 and adjacent to a source region and a drain region, respectively. Spacers 56 cover the remaining portion of the surface of germanium layer 41 that is not covered by dummy gate structure 50. Spacers 56 may include one or more layers of oxide and nitride.

Figure 11A:
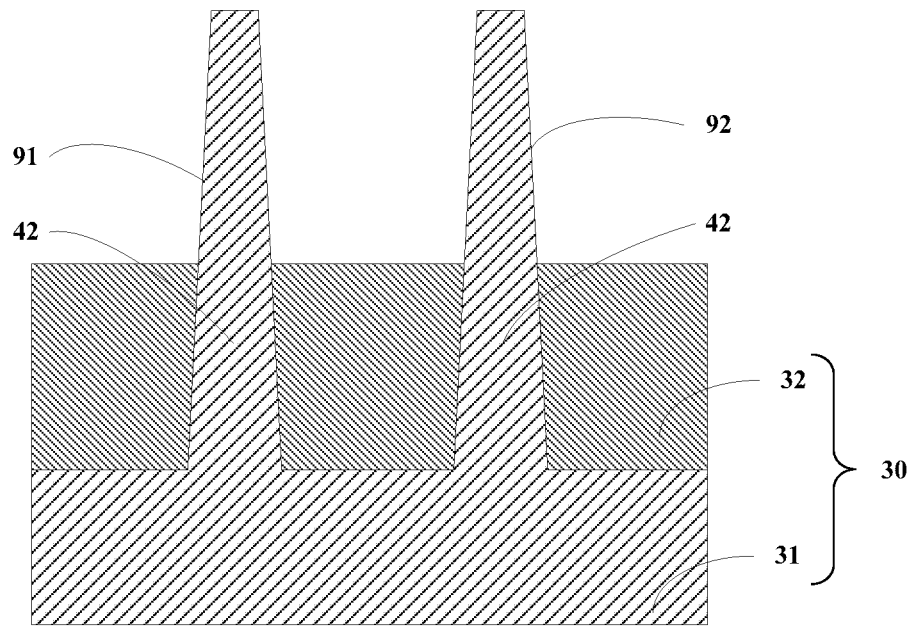
FIG. 11A is a cross-sectional view illustrating an intermediate stage of a manufacturing method according to some embodiments of the present disclosure.
Figure 11B:
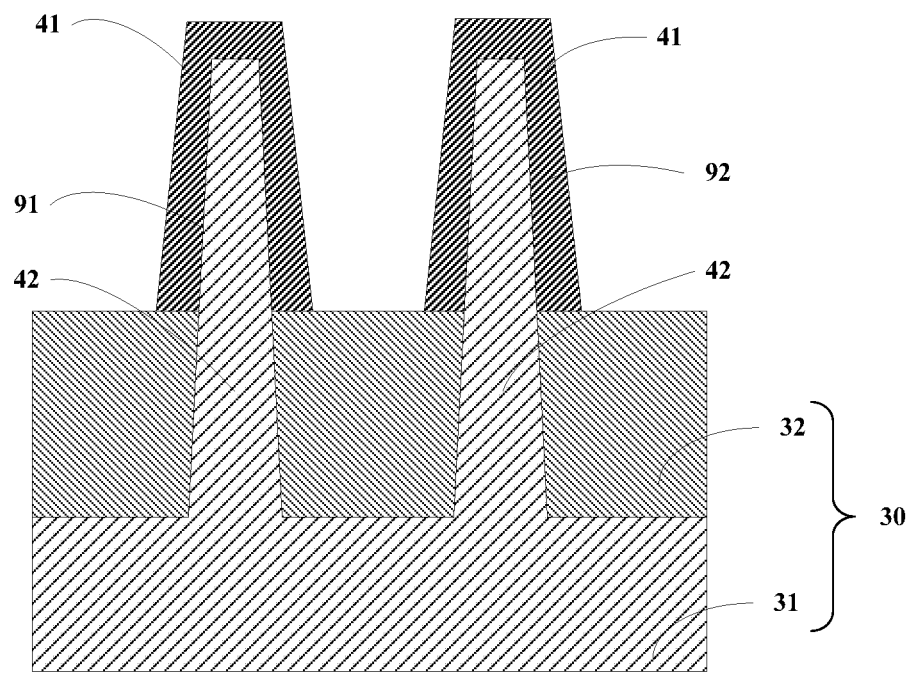
FIG. 11B is a cross-sectional view illustrating an intermediate stage of a manufacturing method according to some embodiments of the present disclosure.

It is noted that the cross-sectional view shown in FIG. 2 is a cross section of the fins along the longitudinal direction (i.e., lengthwise cross-sectional view); the cross-section of the fins including the germanium layer along the transverse direction (i.e., cross-wise direction) are best shown in FIG. 11B. It will be noted that for a better understanding, the manufacturing method of a semiconductor device will be described in detail in conjunction with FIGS. 11A through 11E.

In some embodiments of the present disclosure, each of the fins include a germanium layer 41 disposed on the surface of the fins along the cross-section in the transverse (cross-wise) direction, as shown in FIG. 11B.

In some embodiments, each of the fins includes a silicon layer 42 below the germanium layer 41, as shown in FIG. 2.

In some embodiments, fins 40 may include a first set of fins 91 configured to form first type devices (e.g., NMOS transistors) and a second set of fins 92 configured to form second type devices (e.g., PMOS devices), as shown in FIG. 2.

In some embodiments, substrate structure 30 may also include a dielectric layer (e.g., silicon dioxide) 32 on substrate 31. In this case, the fins protrude from dielectric layer 32, and dummy gate insulating material 51 and dummy gate 52 are above dielectric layer 32.

It is to be understood that, as used herein, the term "fin" refers to a vertical structure protruding from the substrate structure, which includes the substrate or the substrate and the dielectric layer disposed thereon, however, the term "fin" may also refer broadly as the fin structure of a FinFET device.

In some embodiments, semiconductor structure 20 also includes a source region and a drain region adjacent to germanium layer 41. For example, referring to FIG. 2, in the first set of fins 91, semiconductor structure 20 includes a first source region 61 and a first drain region 62 on opposite sides of and adjacent to germanium layer 41. In the second set of fins 92, semiconductor structure 20 includes a second source region 71 and a second drain region 72 on opposite sides of and adjacent to germanium layer 41.

In some embodiments, the source and drain regions include silicon germanium (SiGe) or silicon phosphorus (SiP) to apply stress to the channel region. For example, first source and drain regions 61, 62 include SiP, and second source and drain regions 71, 72 include SiGe. It is understood that the source and drain regions can be epitaxially grown from silicon layer 42, and in-situ doped during the growth process.

As shown in FIG. 2, first source region 61 may include a heavily doped region 63, first drain region 62 may include a heavily doped region 64. Second source region 71 may include a heavily doped region 73, second drain region 72 may include a heavily doped region 74.

Referring back to FIG. 1, in block S102, an interlayer dielectric layer is formed on the substrate structure to cover the dummy gate structure.

Figure 3:
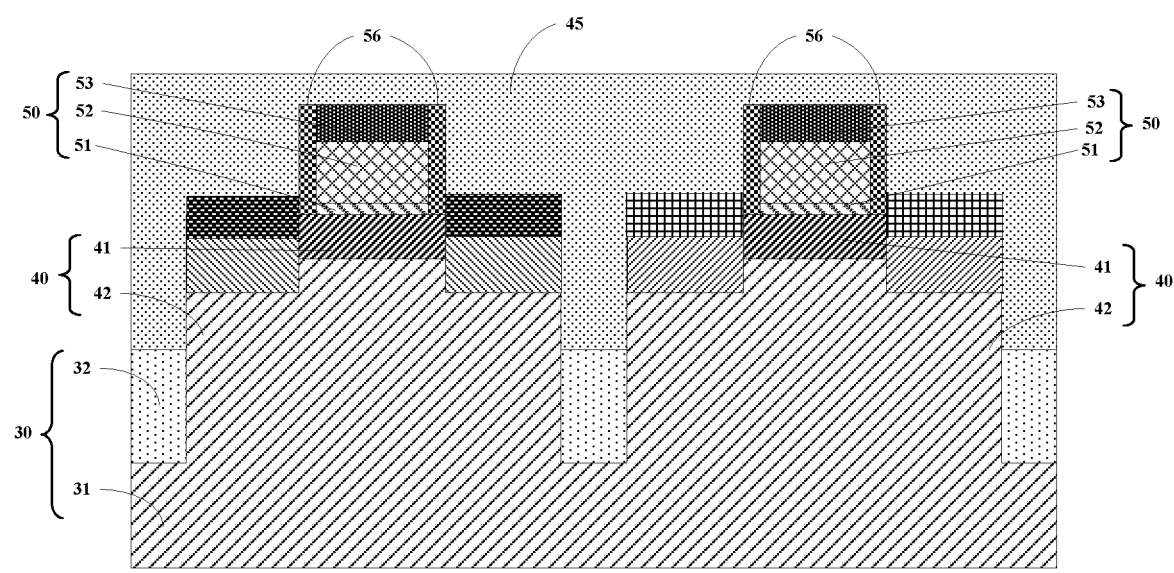
FIG. 3 is a cross-sectional view illustrating an intermediate stage of a manufacturing method according to some embodiments of the present disclosure.

FIG. 3 is a cross-sectional view illustrating an intermediate structure according to block S102. As shown in FIG. 3, an interlayer dielectric layer 45 is formed, e.g., by deposition, on the substrate structure 30 to cover the dummy gate structure 50. For example, interlayer dielectric layer 45 includes silicon dioxide.

Referring back to FIG. 1, in block S103, a planarization process is performed on the interlayer dielectric layer to expose a surface of the dummy gate.

Figure 4:
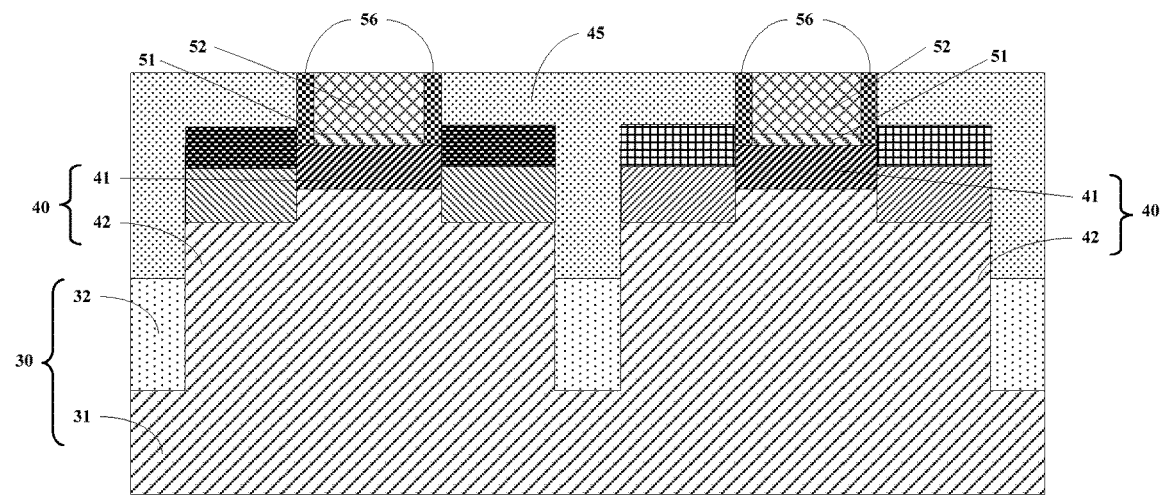
FIG. 4 is a cross-sectional view illustrating an intermediate stage of a manufacturing method according to some embodiments of the present disclosure.

FIG. 4 is a cross-sectional view illustrating an intermediate structure according to block S103. As shown in FIG. 4, after the formation of the interlayer dielectric layer, a planarization (e.g., chemical mechanical polishing) process is performed on the interlayer dielectric layer to expose a surface of dummy gate 52.

Referring back to FIG. 1, in block S104, the dummy gate and the dummy gate insulating material are removed to expose a surface of the germanium layer.

Figure 5:
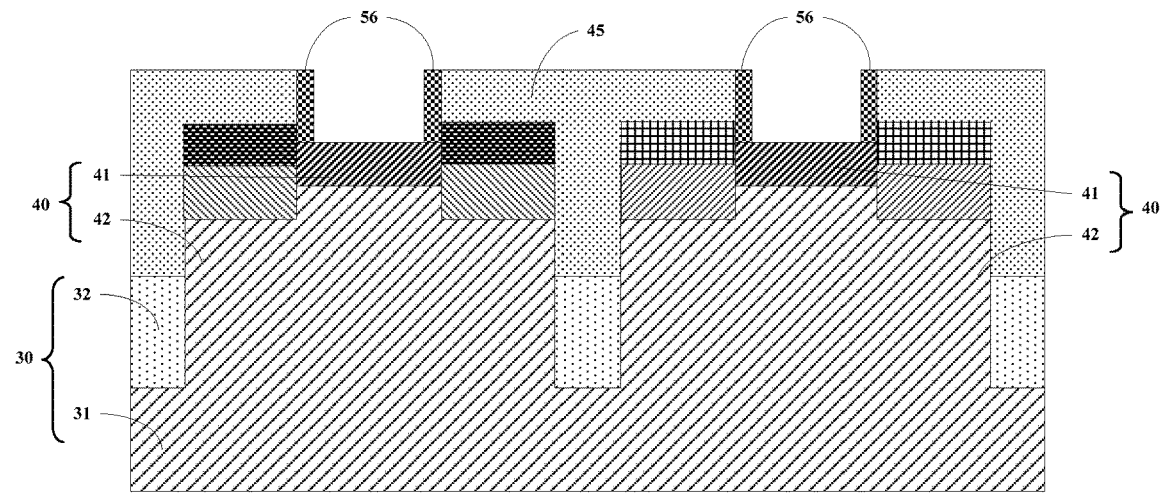
FIG. 5 is a cross-sectional view illustrating an intermediate stage of a manufacturing method according to some embodiments of the present disclosure.

FIG. 5 is a cross-sectional view illustrating an intermediate structure according to block S104. As shown in FIG. 5, dummy gate 52 and dummy gate insulating material 51 are removed to expose a surface of germanium layer 41.

Referring back to FIG. 1, in block S105, the exposed surface of the germanium layer is impregnated with silane to introduce silicon atoms into the germanium layer.

Figure 6:
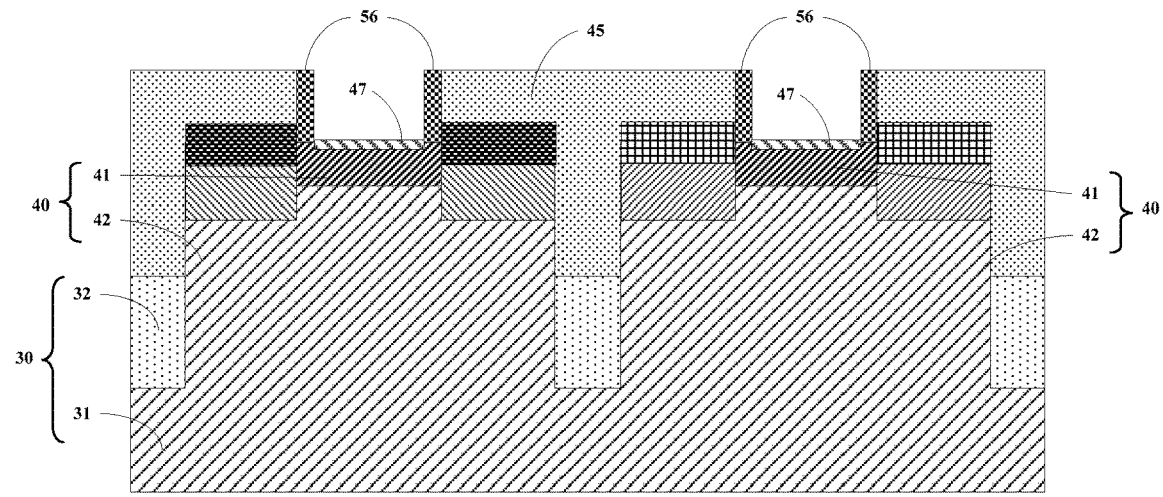
FIG. 6 is a cross-sectional view illustrating an intermediate stage of a manufacturing method according to some embodiments of the present disclosure.

FIG. 6 is a cross-sectional view illustrating an intermediate structure according to block S105. As shown in FIG. 6, the exposed surface of germanium layer 41 is impregnated with silane to introduce silicon atoms into the germanium layer to form a first surface layer 47 comprising silicon and germanium.

In the embodiment, the silane impregnation process may be performed at a temperature between 400 degrees C. and 500 degrees C., preferably 450 degrees C., the semiconductor structure is immersed in a silane atmosphere between 1 minutes and 30 minutes (e.g., 5, 10, or 20 minutes), and under a pressure of 5 Torr to 20 Torr, preferably 10 Torr. Silicon (silane) may be absorbed on the surface of the germanium layer, or into the surface of the germanium layer at a depth within about 1 nm.

Referring back to FIG. 1, in block S106, a first oxidation process is performed on the exposed surface of the silicon absorbed germanium layer to form an oxide layer comprising silicon and germanium elements.

Figure 7:
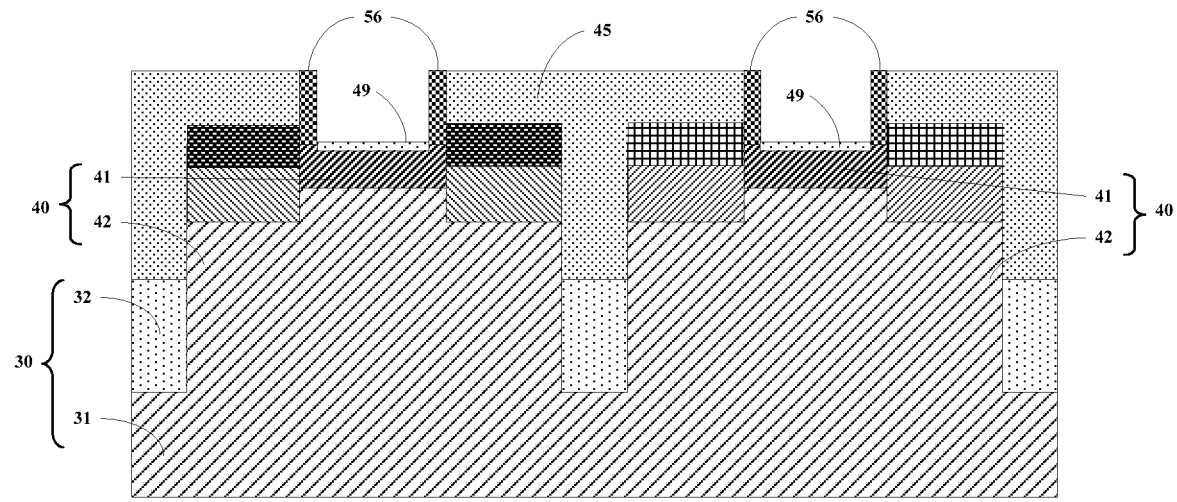
FIG. 7 is a cross-sectional view illustrating an intermediate stage of a manufacturing method according to some embodiments of the present disclosure.

FIG. 7 is a cross-sectional view illustrating an intermediate structure according to block S106. As shown in FIG. 7, a first oxidation process is performed on the exposed surface of first surface layer 47 to form an oxide layer 49, oxide layer 49 includes silicon and germanium. Oxide layer 49 may include silicon oxide and germanium oxide, including but not limited to $SiO_2$, $GeO_2$, and $SiGeO_2$. For example, the first oxidation process may be performed using an in-situ steam generation (ISSG) process or rapid thermal oxidation (RTO) process. The oxide layer has a thickness of 10 angstroms to 40 angstroms.

Thus, a method for manufacturing a semiconductor device has been provided by embodiments of the present disclosure. The above-described method can reduce defects in the surface of the germanium layer of a fin, reduce the defect density, thereby improving the performance and reliability of the thus manufactured semiconductor device.

Figure 8:
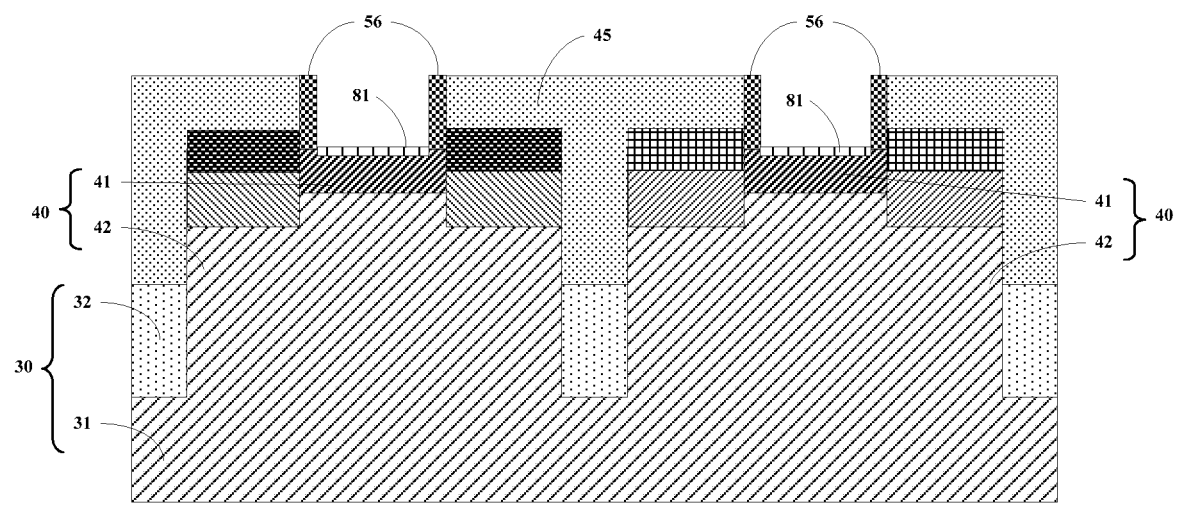
FIG. 8 is a cross-sectional view illustrating an intermediate stage of a manufacturing method according to some embodiments of the present disclosure.

In some embodiments, referring to FIG. 8, the method may further include performing a nitridation process on oxide layer 49 to form a nitrogen-containing oxide layer 81. In an embodiment, the nitridation process may be performed using ammonia ($NH_3$), nitrous oxide ($N_2O$), nitric oxide (NO), or nitrogen plasma. The nitridation process can improve the film characteristics of the oxide layer by reducing the equivalent oxide thickness (EOT) of the oxide layer, and further improving the characteristics of the interface between the germanium layer and the oxide layer (nitrogen-containing oxide layer), thereby further improving the performance and reliability of the semiconductor device.

Figure 9:
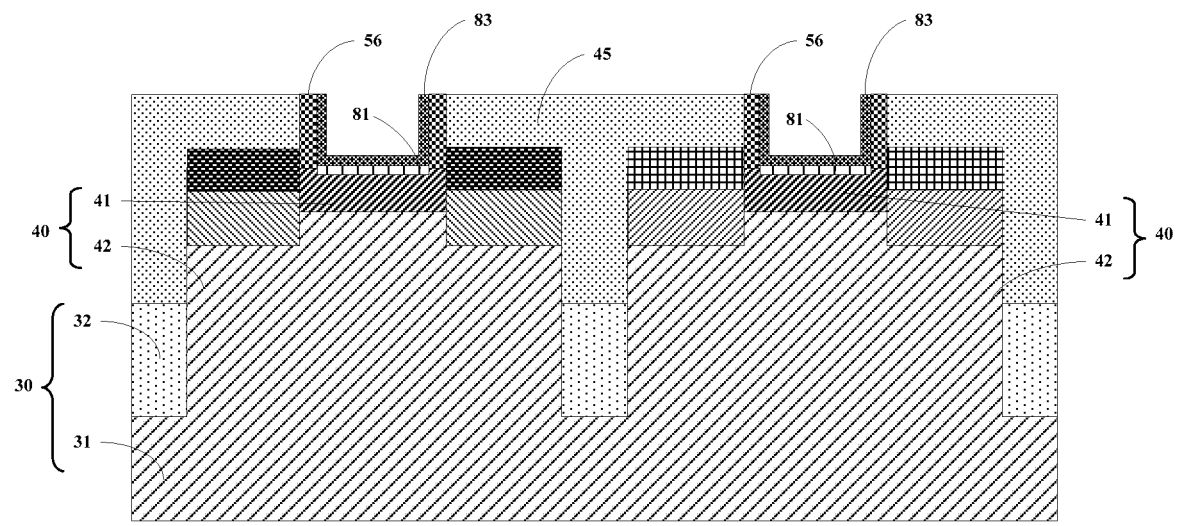
FIG. 9 is a cross-sectional view illustrating an intermediate stage of a manufacturing method according to some embodiments of the present disclosure.

Next, referring to FIG. 9, the method may also include forming a high-k dielectric layer 83 on nitrogen-containing oxide layer 81 and inner sidewalls of spacers 56. It should be noted that the inner sidewalls of the spacers refer to the sidewalls facing the trench or facing the gate or dummy gate.

In other embodiments, the high-k dielectric layer may be formed on the oxide layer and the sidewalls of the spacers. That is, the high-k dielectric layer is formed on the oxide layer prior to the nitridation and the sidewalls of the spacers.

Next, the method according to the present disclosure may further include performing a second oxidation process on high-k dielectric layer 83, in order to reduce vacancies in the high-k dielectric layer. In some embodiments, the second oxidation process is performed in an atmosphere comprising oxygen, at a temperature in the range between 450° C. and 550° C., preferably at 500° C. The oxygen concentration may be less than 10 ppm. Through the second oxidation process, oxygen atoms fill the vacancies in the high-k dielectric layer, thereby improving the semiconductor device reliability.

Figure 10:
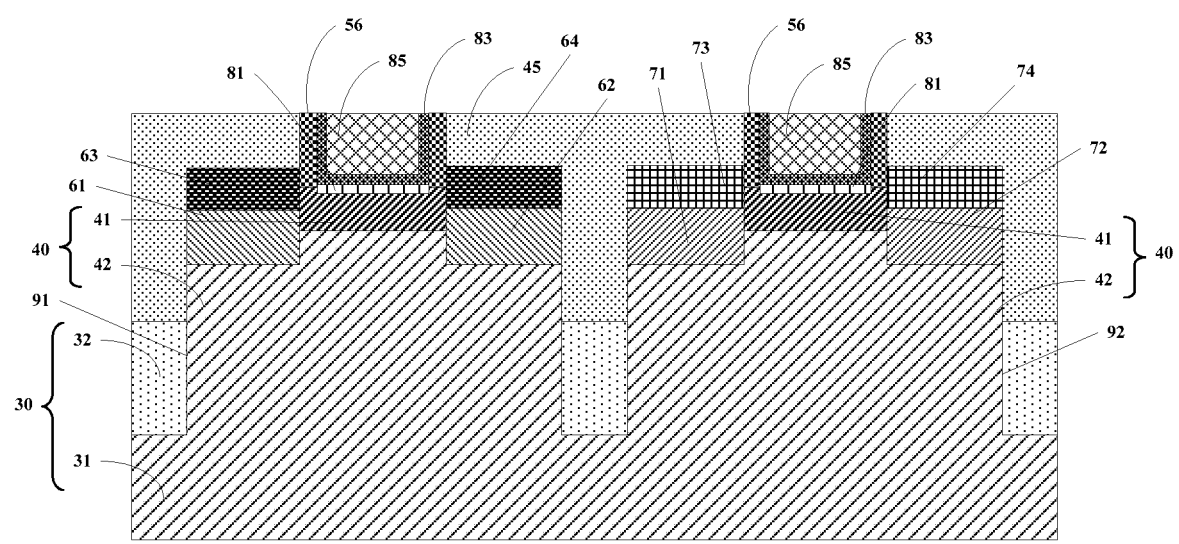
FIG. 10 is a cross-sectional view illustrating an intermediate stage of a manufacturing method according to some embodiments of the present disclosure.

Next, referring to FIG. 10, the method may further include forming a gate 85 on the high-k dielectric layer. The gate is a conductive gate. The gate may include a metal gate and a conductive functional layer disposed between the metal gate and the high-k dielectric layer. The conductive functional layer may be a TaN buffer layer, a work-function adjusting layer, etc. The metal gate may include copper or aluminum. In an embodiment, the conductive functional layer (if present) and the gate material layer may be firstly deposited on the structure shown in FIG. 10, then a planarization (e.g., CMP) process is performed on the gate material layer to form the gate.

Thus, embodiments of the present disclosure further provide a method for manufacturing a semiconductor device, which can reduce the defect density of the oxide layer and vacancies in the high-k dielectric layer, thereby improving the semiconductor device reliability.

FIGS. 11A through 11F are cross-sectional views of intermediate structures of a method for manufacturing a semiconductor device according to some embodiments of the present disclosure.

Referring to FIG. 11A, an initial structure 100 is provided. Initial structure 100 may include a substrate structure 30, and a plurality of initial fins including a semiconductor layer 42. The semiconductor layer may include a silicon layer, a silicon germanium layer, or other similar semiconductor materials layer. Substrate structure 30 includes a substrate (e.g. silicon) 31. In the embodiment, the substrate structure may further include a dielectric layer (e.g., silicon dioxide) 32 on substrate 31. The fins protrude from dielectric layer 32, as shown in FIG. 11A. It is understood that, although substrate 31 is shown as a bulk silicon-based substrate herein, the present disclosure is not limited thereto. For example, substrate 31 may be a silicon on insulator (SOI) substrate. In this case, the fins may be formed on the buried oxide layer (insulating layer), so that dielectric layer 32 is not required.

In some embodiments, the fins may include a first set of fins 91 configured to form first type devices (e.g., NMOS transistors) and a second set of fins 92 configured to form second type devices (e.g., PMOS transistors), as shown in FIG. 11A.

Next, an initial germanium layer 41 is formed on semiconductor layer 42, as shown in FIG. 11B. In some embodiments, initial germanium layer 41 may be formed on semiconductor layer 42 using an epitaxial growth process, as shown in FIG. 11B. The semiconductor layer may include a silicon layer, the epitaxial growth process may be performed on the silicon layer in a mixed gas of silane and germane, the concentration ratio of silane and germane gas is controlled in order to reduce the silane concentration with time, i.e., increasing the germane content and decreasing the silane content until the silane content is reduced to zero to form the initial germanium layer 41. It is, however, understood that the initial germanium layer can be formed using other processes.

Figure 11C:
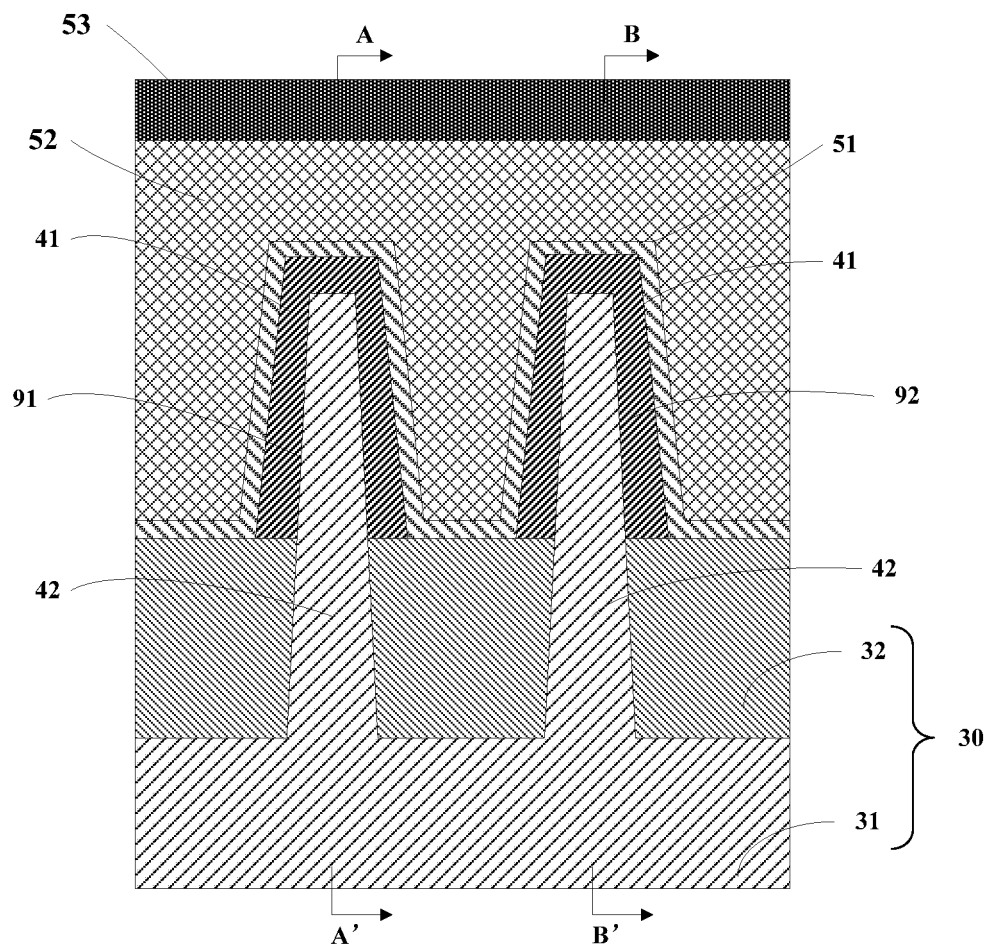
FIG. 11C is a cross-sectional view illustrating an intermediate stage of a manufacturing method according to some embodiments of the present disclosure.

Next, a dummy gate insulating layer 51 is formed on germanium layer 41, a dummy gate material layer 52 is formed on dummy gate insulating layer 51, and a hardmask layer 53 is formed on dummy gate material layer 52, as shown in FIG. 11C. For example, dummy gate insulating layer 51 is formed using a deposition process on initial germanium layer 41, dummy gate material layer 52 is formed using a deposition process on dummy gate insulating layer 51, and hardmask layer 53 is formed using a deposition process on dummy gate material layer 52.

Figure 11D:
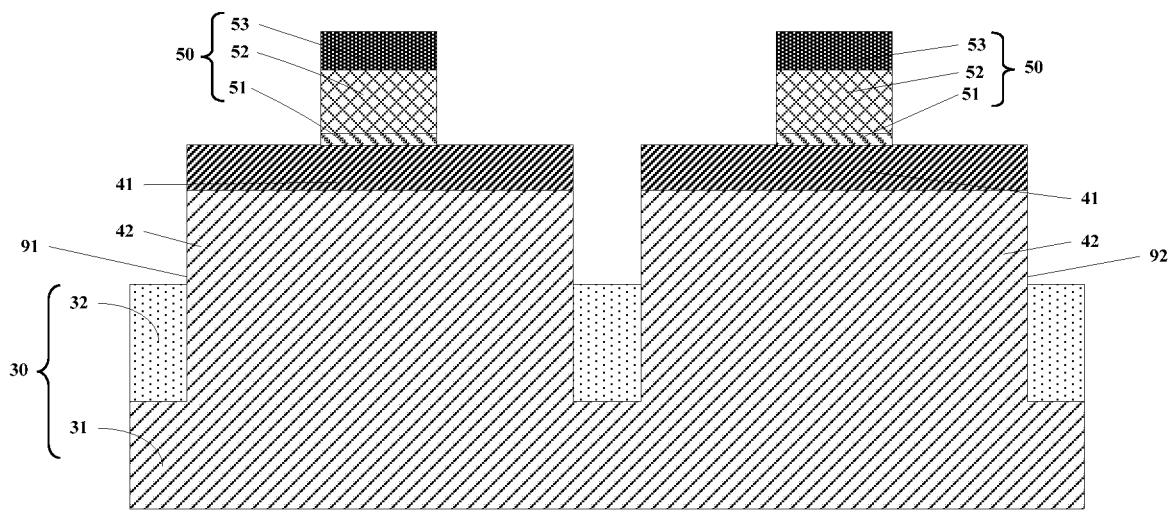
FIG. 11D is a cross-sectional view illustrating an intermediate stage of a manufacturing method according to some embodiments of the present disclosure.

Next, a portion of hardmask layer 53, a portion of dummy gate material layer 52, and a portion of dummy gate insulating layer 51 are removed by etching using a patterned mask (not shown) to form a dummy gate structure 50, as shown in FIG. 11D. Dummy gate structure 50 includes a dummy gate insulating material 51, a dummy gate 52, and a hardmask 53. For the convenience of description, the structure shown in FIG. 11D is a cross-sectional view of the structure of the first set of fins and second set of fins of FIG. 11C taken in the direction along the lines AA' and BB', respectively.

Figure 11E:
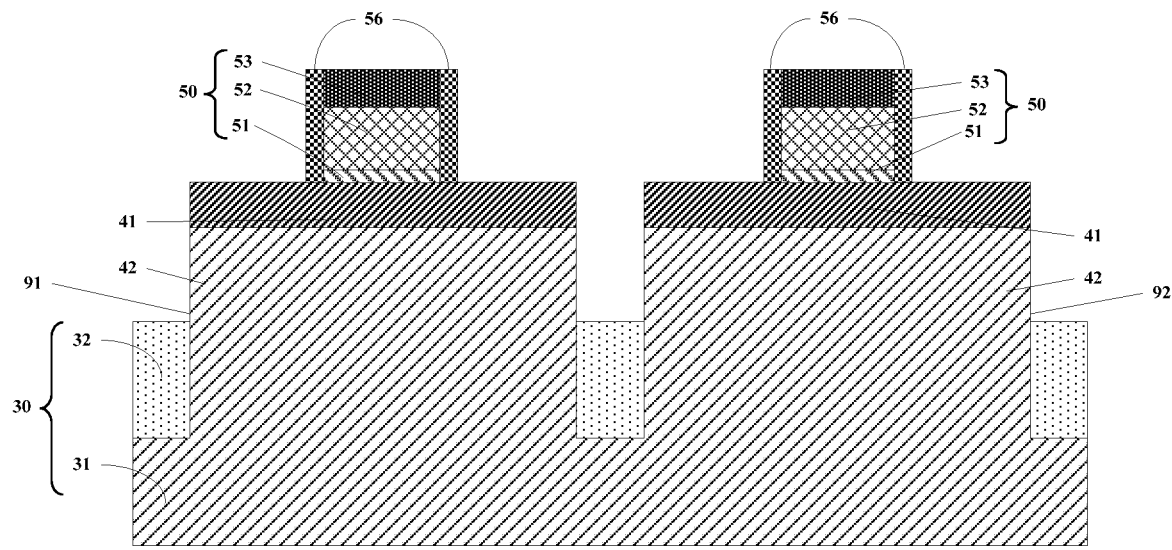
FIG. 11E is a cross-sectional view illustrating an intermediate stage of a manufacturing method according to some embodiments of the present disclosure.

Next, spacers 56 are respectively formed on opposite sidewalls of dummy gate structure 50, as shown in FIG. 11E.

Figure 11F:
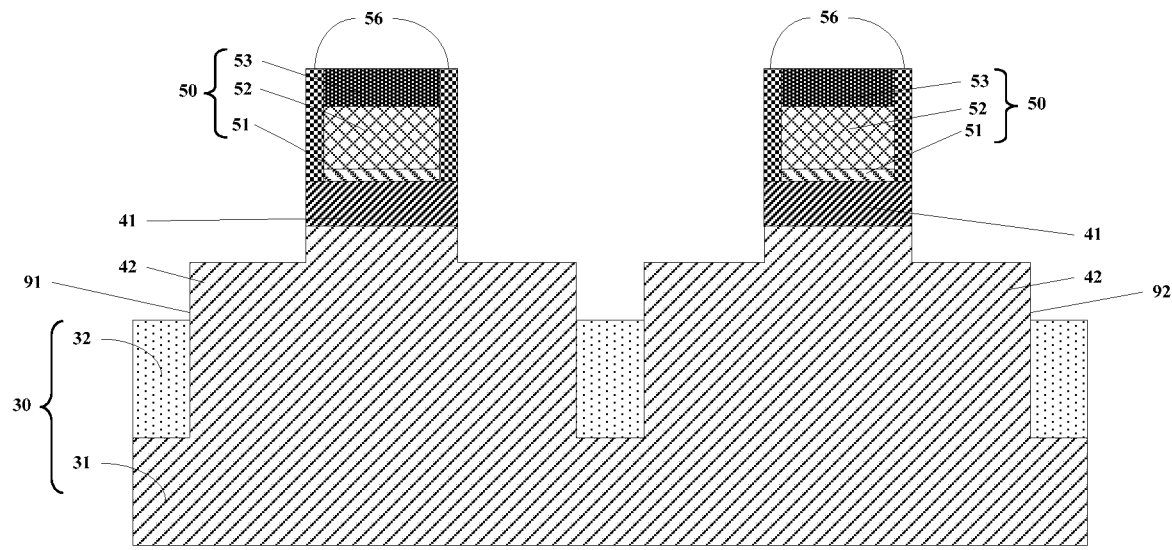
FIG. 11F is a cross-sectional view illustrating an intermediate stage of a manufacturing method according to some embodiments of the present disclosure.

Next, a portion of initial germanium layer 41 and a portion of semiconductor layer 42 below the portion of initial germanium layer 41 are removed by etching using gate structure 50 and spacers 56 as a mask to obtain a structure as shown in FIG. 11F.

Thus, embodiments of the present disclosure provide a method for manufacturing a semiconductor device.

In one embodiment, the method may further include forming a source region and a drain region adjacent to the opposite sides of the remaining portion of the initial germanium layer, and a heavily doped region in the respective source and drain regions, as shown in FIG. 2. The processes of forming source and drain regions and the heavily doped regions in the source and drain regions are known to those of skill in the art, so the description is omitted herein for the sake of brevity.

Embodiments of the present disclosure also provide a semiconductor device. Referring back to FIG. 10, a semiconductor device includes a substrate structure 30 having a substrate (e.g., silicon) 31, and a plurality of fins 40, each of the fins includes a germanium layer 41 on its upper surface. The semiconductor device also includes spacers 56 on an upper surface of the opposite sides of germanium layer 41, and an oxide layer on the remaining upper surface of germanium layer 41 not covered by the spacers. The oxide layer includes silicon and germanium. In an exemplary embodiment, the oxide layer may include a nitrogen-containing oxide layer 81. The semiconductor device further includes a high-k dielectric layer 83 on the oxide layer and on the inner sidewalls of the spacers, and a gate 85 on high-k dielectric layer 83. High-k dielectric layer 83 is disposed between gate 85 and spacers 56. In some embodiments, the spacers may include one or more layers of oxide and nitride. Such gate structure reduces defects in the surface of the germanium layer and improves the reliability of the semiconductor device.

In some embodiments, high-k dielectric layer 83 through the oxidation treatment has substantially reduced oxygen vacancies, so that the device reliability is improved.

In some embodiments, the fins each include a germanium layer and a semiconductor layer below the germanium layer. The germanium layer is on the top surface and lateral surfaces of the fins in the transverse direction (i.e., crosswise direction perpendicular to the lengthwise direction of the fins, as shown in FIGS. 11B and 11C).

As shown in FIG. 10, substrate structure 30 may also include a dielectric layer 32 on substrate 31. The fins 40 protrude from dielectric layer 32, and oxide layer (e.g., nitrogen-containing oxide layer) 81, high-k dielectric layer 83, and gate 85 are disposed over dielectric layer 32, as shown in FIG. 10.

In some embodiments, the fins 40 may include a first set of fins configured to form first type devices (e.g., NMOS transistors) and a second set of fins configured to form second type devices (e.g., PMOS transistors).

In some embodiments, the semiconductor device also includes source and drain regions at the outer side of spacers 56 facing away from gate electrode 85. For example, FIG. 10 illustrates a first source region 61 and a first drain region 62 disposed on opposite sides of germanium layer 41 of first set of fins 91, and a second source region 71 and a second drain region 72 disposed on opposite sides of germanium layer 41 of second set of fins 92.

In some embodiments, the source and drain regions include SiGe or SiP. For example, first source region 61 and first drain region 62 include SiP, and second source region 71 and second drain region 72 include SiGe.

In some embodiments, the semiconductor device also includes a heavily doped region in the source region and a heavily doped region in the drain region. Referring to FIG. 10, the semiconductor device includes a heavily doped region 63 in first source region 61 and a heavily doped region 64 in first drain region 62, and a heavily doped region 73 in second source region 71 and a heavily doped region 74 in second drain region 72.

In some embodiments, the semiconductor device also includes an interlayer dielectric layer 45 on the substrate structure, interlayer dielectric layer 45 surrounds spacers 56, high-k dielectric layer 83, and gate 85.

Preferred embodiments of the present disclosure have been described in detail hereinabove. It is to be understood that the scope of the invention also comprehends embodiments from those described, yet within the scope of the claims.

While the present disclosure is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

Furthermore, some of the features of the preferred embodiments of the present disclosure could be used to advantage without the corresponding use of other features. As such, the foregoing description should be considered as merely illustrative of the principles of the invention, and not in limitation thereof.

What is claimed is:

1. A semiconductor device, comprising:
a substrate structure comprising a substrate;
a plurality of fins each protruding from the substrate structure;
a germanium layer on a top surface of the fins;
spacers on opposite sides of the germanium layer and in direct contact with the germanium layer;
an oxide layer on a surface of the germanium layer between the spacers, the oxide layer comprising silicon and germanium;
a high-k dielectric layer on the oxide layer and on inner sidewalls of the spacers; and
a gate electrode on the high-k dielectric layer.

2. The semiconductor device of claim 1, wherein the oxide layer is a nitrogen-containing oxide layer.

3. The semiconductor device of claim 1, further comprising:
a source region and a drain region adjacent opposite sides of the germanium layer.

4. The semiconductor device of claim 3, wherein the source region and the drain region comprise SiGe or SiP.

5. The semiconductor device of claim 1, wherein the plurality of fins each comprise a silicon layer below the germanium layer.

6. The semiconductor device of claim 1, wherein the plurality of fins comprise a first set of fins forming a first type of devices and a second set of fins forming a second type of devices.

7. The semiconductor device of claim 1, wherein the substrate structure further comprises a dielectric layer on the substrate, wherein the plurality of fins protrude from the dielectric layer, and the oxide layer, the high-k dielectric layer, and the gate electrode are disposed above the dielectric layer.

8. The semiconductor device of claim 1, further comprising an interlayer dielectric layer on the substrate structure, wherein the interlayer dielectric layer surrounds the spacers, the high-k dielectric layer, and the gate electrode.

9. The semiconductor device of claim 1, wherein the plurality of fins comprise a first set of fins configured to form NMOS transistors and a second set of fins configured to form PMOS transistors.

10. The semiconductor device of claim 1, wherein the oxide layer comprises $SiO_2$, $GeO_2$, and $SiGeO_2$.

* * * * *